(12) United States Patent
Lee et al.

(10) Patent No.: US 9,819,891 B2
(45) Date of Patent: Nov. 14, 2017

(54) IMAGE SENSOR FOR DISTRIBUTING OUTPUT PEAK CURRENT AND IMAGE PROCESSING SYSTEM INCLUDING THE SAME

(71) Applicant: Samsung Electronics Co., Ltd., Suwon-si, Gyeonggi-do (KR)

(72) Inventors: Han Soo Lee, Hwaseong-si (KR); Hee Sung Chae, Seoul (KR); Kyung Min Kim, Seoul (KR); Dah Som Kim, Ansan-si (KR); Sun Jung Kim, Yongin-si (KR); Seung Hoon Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/989,220

(22) Filed: Jan. 6, 2016

(65) Prior Publication Data

US 2016/0366359 A1 Dec. 15, 2016

(30) Foreign Application Priority Data

Jun. 12, 2015 (KR) ........................ 10-2015-0083430

(51) Int. Cl.
*H04N 5/378* (2011.01)
*H03M 1/00* (2006.01)
*H04N 5/357* (2011.01)

(52) U.S. Cl.
CPC .............. *H04N 5/378* (2013.01); *H03M 1/00* (2013.01); *H04N 5/357* (2013.01)

(58) Field of Classification Search
CPC ..................................................... H04N 5/357
See application file for complete search history.

(56) References Cited

U.S. PATENT DOCUMENTS

| | | | |
|---|---|---|---|
| 7,565,588 B2 * | 7/2009 | Nakashima | G11C 7/1036 714/718 |
| 7,903,160 B2 | 3/2011 | Taguchi et al. | |
| 8,735,796 B2 | 5/2014 | Shimizu et al. | |
| 9,491,391 B2 * | 11/2016 | Smith | H01L 27/14641 |
| 2009/0109308 A1 * | 4/2009 | Fukushima | H01L 27/1464 348/294 |

(Continued)

FOREIGN PATENT DOCUMENTS

KR 20130106221 A 9/2013

*Primary Examiner* — James Hannett
(74) *Attorney, Agent, or Firm* — Harness, Dickey & Pierce, P.L.C.

(57) ABSTRACT

The image sensor includes a first analog-to-digital converter configured to convert a first analog pixel signal output from a first pixel in a row into first digital signals, a second analog-to-digital converter configured to convert a second analog pixel signal output from a second pixel in the row into second digital signals, a first output circuit configured to output a first bit value at a first position in the first digital signals in response to a first enable control signal, and a second output circuit configured to output a second bit value at a second position in the second digital signals in response to a second enable control signal, the second position in the second digital signals corresponding to the first position in the first digital signals, wherein the second enable control signal is activated with a delay from the activation of the first enable control signal.

17 Claims, 12 Drawing Sheets

(56) References Cited

U.S. PATENT DOCUMENTS

| | | |
|---|---|---|
| 2010/0188380 A1 | 7/2010 | Nose |
| 2012/0002088 A1* | 1/2012 | Fukushima .......... H04N 3/1512 348/294 |
| 2012/0314110 A1 | 12/2012 | Kobayashi et al. |
| 2013/0001429 A1 | 1/2013 | Dowaki et al. |
| 2013/0243147 A1* | 9/2013 | Kim .................... H03M 1/0863 377/42 |
| 2014/0211055 A1* | 7/2014 | Wakabayashi ...... H03M 1/0658 348/302 |
| 2014/0266309 A1* | 9/2014 | Jakobson ............... H04N 5/378 327/63 |
| 2014/0372823 A1 | 12/2014 | Dimri |
| 2015/0009387 A1 | 1/2015 | Taura |

\* cited by examiner

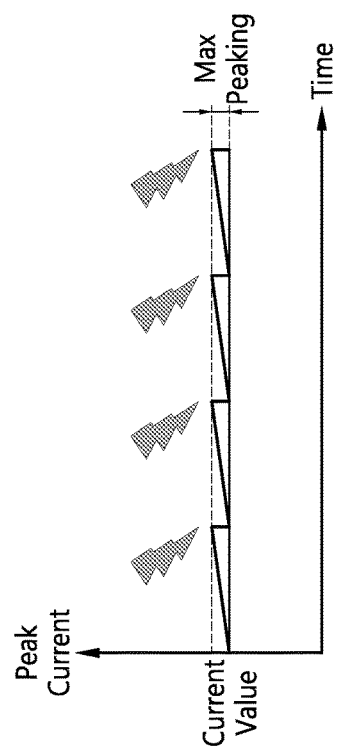
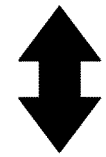
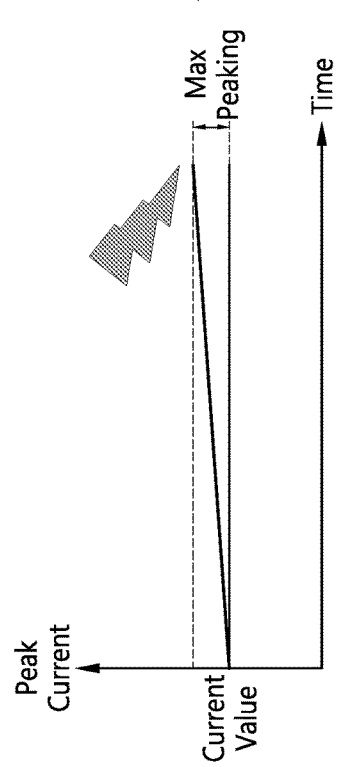
FIG. 5B
FIG. 5A

TABLE1

| SEL | Enable Signals |
|---|---|
| SEL1 | EN_W<i> = EN_X<i> = EN_Y<i> = EN_Z<i><br>$0 \leq i \leq n$ |
| SEL2 | EN_W<i> = EN_X<i> and<br>EN_Y<i> = EN_Z<i> |
| SEL3 | EN_W<i> ≠ EN_X<i> ≠ EN_Y<i> ≠ EN_Z<i> |

IMAGE SENSOR FOR DISTRIBUTING OUTPUT PEAK CURRENT AND IMAGE PROCESSING SYSTEM INCLUDING THE SAME

CROSS-REFERENCE TO RELATED APPLICATION

This application claims priority under 35 U.S.C. §119(a) from Korean Patent Application No. 10-2015-0083430 filed on Jun. 12, 2015, the disclosure of which is hereby incorporated by reference in its entirety.

BACKGROUND

1. Technical Field

Embodiments of the inventive concepts relate to an image sensor, and more particularly, to an image sensor for distributing an output peak current and an image processing system including the same.

2. Description of the Related Art

A complementary metal oxide semiconductor (CMOS) image sensor is an image pickup device manufactured using CMOS processes. The CMOS image sensor has lower manufacturing cost and smaller pixel size than a charge coupled device (CCD) image sensor having a high-voltage analog circuit and thus has an advantage of low power consumption. In addition, with the improvement of the performance of CMOS image sensors, CMOS image sensors are widely used for mobile electronic devices such as smart phones, tablet personal computers (PCs), and digital cameras.

In high-resolution CMOS image sensors, a data bus is a block that finally processes digital signals corresponding to analog pixel signals output from pixels. When digital signals, i.e., image data are processed at high speed; a conventional CMOS image sensor usually transmit digital signals corresponding to column lines to buffers using a sensor amplifier. When the digital signals corresponding to the column lines are output to the buffers at the same time, a transient peak current may occur. The transient peak current may lead to the drop of voltage, which may severely affect high-speed circuits, e.g., analog-to-digital converters, which convert analog pixel signals into digital signals.

SUMMARY

According to some embodiments of the inventive concepts, there is provided an image sensor including a first analog-to-digital converter configured to convert a first analog pixel signal output from a first pixel in a row into first digital signals, a second analog-to-digital converter configured to convert a second analog pixel signal output from a second pixel in the row into second digital signals, a first output circuit configured to output a first bit value at a first position in the first digital signals in response to a first enable control signal, and a second output circuit configured to output a second bit value at a second position the same as the first position in the second digital signals in response to a second enable control signal, the second position in the second digital signals thus corresponding to the first position in the first digital signals. The second enable control signal is activated with a delay from the activation of the first enable control signal.

The image sensor may further include a first transmission line configured to transmit the first enable control signal and a second transmission line configured to transmit the second enable control signal. The image sensor may further include an enable signal generator configured to generate the first enable control signal and the second enable control signal, which are independent from each other, at different enable timings.

The image sensor may further include a register and an enable signal generator configured to control enable timings of the first enable control signal and the second enable control signal in response to a select signal output from the register.

The enable signal generator may generate the first enable control signal and the second enable control signal which are enabled at one enable timing in response to the select signal having a first value and may generate the first enable control signal and the second enable control signal which are enabled at different enable timings in response to the select signal having a second value.

The first analog-to-digital converter may include a first comparator configured to compare a ramp signal with the first analog pixel signal and generate a first comparison signal and a first counter configured to count a level transition time of the first comparison signal in response to a clock signal and output the first digital signals. The first output circuit may include a first memory configured to store the first bit value, a first output driver, and a first switch configured to control connection between the first memory and the first output driver in response to the first enable control signal.

The second analog-to-digital converter may include a second comparator configured to compare the ramp signal with the second analog pixel signal and generate a second comparison signal and a second counter configured to count a level transition time of the second comparison signal in response to the clock signal and output the second digital signals. The second output circuit may include a second memory configured to store the second bit value, a second output driver, and a second switch configured to control connection between the second memory and the second output driver in response to the second enable control signal. The first memory and the second memory each may be a latch or static random access memory (SRAM). The first pixel and the second pixel may be arranged in one row.

According to other embodiments of the inventive concepts, there is provided an image processing system including an image sensor and a controller configured to control an operation of the image sensor. The image sensor includes a first analog-to-digital converter configured to convert a first analog pixel signal output from a first pixel in a row into first digital signals, a second analog-to-digital converter configured to convert a second analog pixel signal output from a second pixel in the row into second digital signals, a first output circuit configured to output a first bit value at a first position in the first digital signals in response to a first enable control signal, and a second output circuit configured to output a second bit value at a second position the same as the first position in the second digital signals in response to a second enable control signal, the second position in the second digital signals thus corresponding to the first position in the first digital signals, and wherein the second enable control signal is activated with a delay from the activation of the first enable control signal. A source of the first enable control signal may be different from a source of the second enable control signal.

According to further embodiments of the inventive concepts, there is provided an image sensor including a plurality of analog-to-digital converters configured to respectively convert analog pixel signals, which are respectively output from a plurality of pixels arranged in one row, into n-bit digital signals, where "n" is a natural number of at least 2; and a plurality of output circuits configured to respectively output i-th bits in the respective n-bit digital signals respectively output from the plurality of analog-to-digital converters in response to a plurality of control signals, respectively, which are enabled at different timings, where 1≤i≤n. The plurality of pixels may be adjacent to each other. The plurality of control signals may be transmitted through different transmission lines.

The image sensor may further include a register and an enable signal generator configured to control enable timings of the respective control signals in response to a select signal output from the register.

One of the output circuits may include a memory configured to store the i-th bit in the n-bit digital signal output from one of the analog-to-digital converters, an output driver, and a switch configured to control connection between the memory and the output driver in response to one of the control signals.

BRIEF DESCRIPTION OF THE DRAWINGS

The above and other features and advantages of the inventive concepts will become more apparent by describing in detail example embodiments thereof with reference to the attached drawings in which:

FIGS. 5A and 5B shows waveforms of a peak current in a conventional image sensor and a waveform of a peak current in the image sensor illustrated in FIG. 1, respectively;

DETAILED DESCRIPTION OF THE EMBODIMENTS

Figure 1:
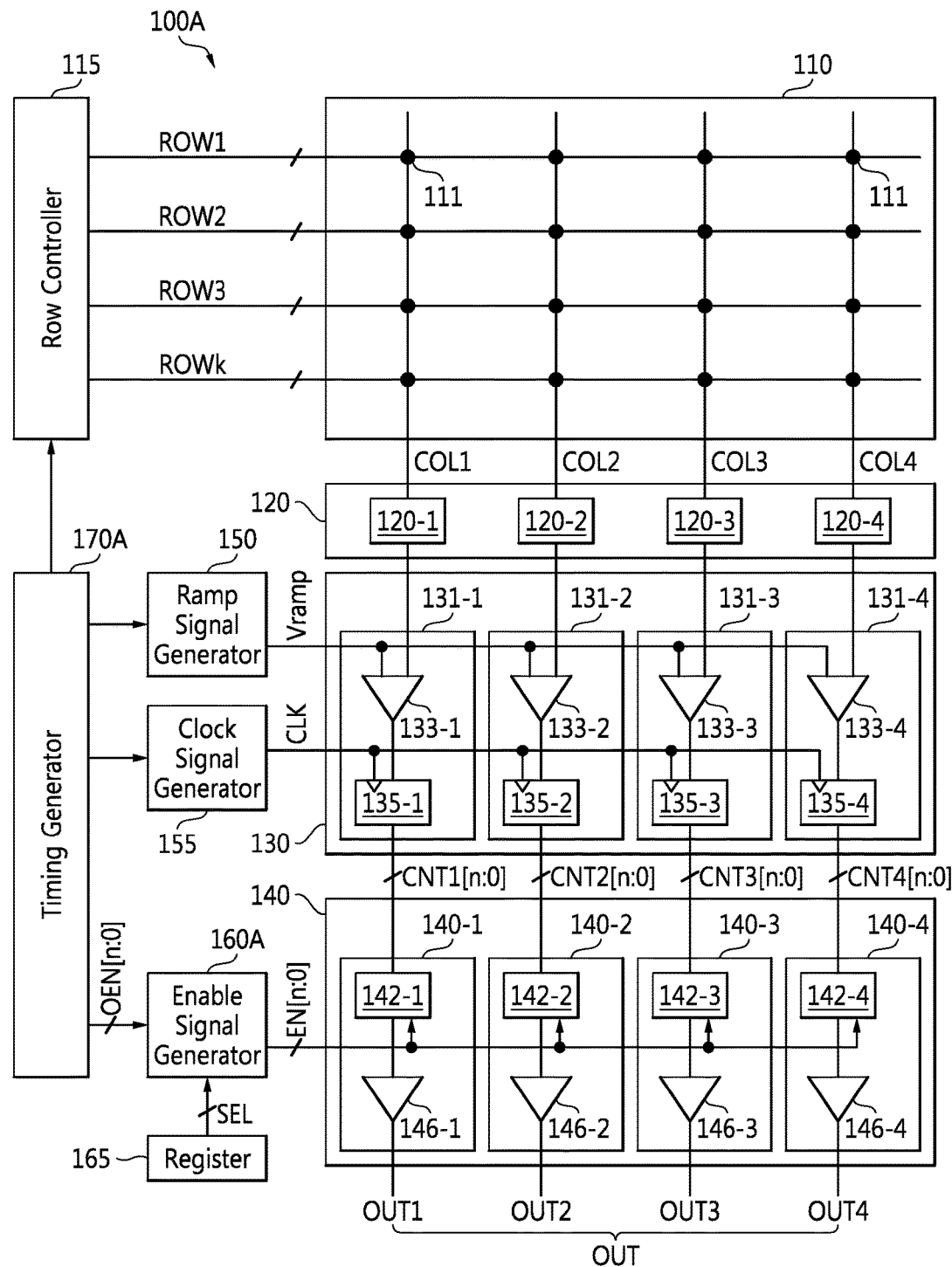
FIG. 1 is a block diagram of an image sensor according to some embodiments of the inventive concepts.

The inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image sensor 100A according to some embodiments of the inventive concepts. Referring to FIG. 1, the image sensor 100A may include a pixel array 110, a row controller 115, a correlated double sampling (CDS) block 120, an analog-to-digital converter (ADC) block 130, an output circuit block 140, a ramp signal generator 150, a clock signal generator 155, an enable signal generator 160A, a register 165, and a timing generator 170A. The image sensor 100A may be classified as a front side illumination (FSI) image sensor or a back side illumination (BSI) image sensor depending on whether a light receiving surface is the front or back side of a substrate.

The pixel array 110 may be an active pixel sensor (APS) array. The pixel array 110 may include a plurality of pixels 111. For example, the pixels 111 may include a red pixel, a green pixel, and a blue pixel, but the inventive concepts is not restricted to this example. The pixels 111 may include a cyan pixel, a yellow pixel, a magenta pixel, and/or a white pixel. In other words, the pixel array 110 may include various kinds of color pixels.

A red pixel may generate a pixel signal corresponding to a red color signal in response to wavelengths in the red range of the visible spectrum (or visible light). A green pixel may generate a pixel signal corresponding to a green color signal in response to wavelengths in the green range of the visible spectrum. A blue pixel may generate a pixel signal corresponding to a blue color signal in response to wavelengths in the blue range of the visible spectrum. A cyan pixel, a yellow pixel, a magenta pixel, or a white pixel may generate a pixel signal corresponding to a corresponding color signal in response to wavelengths in the corresponding color range of the visible spectrum.

For example, each of the pixels 111 may include at least one photoelectric conversion element. The photoelectric conversion element may be a photodiode, a phototransistor, or a photogate, but the inventive concepts is not restricted to these examples. The pixels 111 may be arranged in rows ROW1 through ROWk, where "k" is a natural number of at least 4. The control lines may be formed in each of the rows ROW1 through ROWk to control pixels 111 placed in each row.

The row controller 115 may generate control signals for controlling the operation of the color pixels 111 placed in each of the rows ROW1 through ROWk according to the control of the timing generator 170A. The row controller 115 may include a row decoder and/or a row driver.

The CDS block 120 may include a plurality of CDS circuits 120-1 through 120-4. Each of the CDS circuits 120-1 through 120-4 may perform CDS on an analog pixel signal output from one of column lines COL1 through COL4 and may output a correlated-double-sampled (CDS) analog pixel signal. Each Pixel connected to each of the column lines COL1 through COL4 may transmit an analog pixel signal to corresponding one of the column lines COL1 through COL4 according to the control of the row controller 115.

Although four column lines COL1 through COL4 are illustrated in FIG. 1, the number of column lines included in the pixel array 110 of the image sensor 100A and the number of processing circuits that process analog pixel signals output from the column lines may be variously modified in different embodiments. The processing circuits may include CDS circuits, ADCs, and/or output circuits, but the inventive concepts is not restricted to this example.

The ADC block 130 may convert CDS analog pixel signals output from the CDS block 120 into digital signals based on a ramp signal Vramp and a clock signal CLK. The ADC block 130 may include a plurality of ADCs 131-1 through 131-4. The first ADC 131-1 may convert a first output signal of the first CDS circuit 120-1 into first digital signals CNT1[n:0] based on the ramp signal Vramp and the clock signal CLK. The second ADC 131-2 may convert a second output signal of the second CDS circuit 120-2 into second digital signals CNT2[n:0] based on the ramp signal Vramp and the clock signal CLK. The third ADC 131-3 may convert a third output signal of the third CDS circuit 120-3 into third digital signals CNT3[n:0] based on the ramp signal Vramp and the clock signal CLK. The fourth ADC 131-4 may convert a fourth output signal of the fourth CDS circuit 120-4 into fourth digital signals CNT4[n:0] based on the ramp signal Vramp and the clock signal CLK. The digital signals CNT1[n:0] through CNT4[n:0] may be a digital code or signals including a plurality of bits, respectively. Here, it is assumed that "n" is 10.

The first ADC 131-1 may include a first comparator 133-1 and a first counter 135-1. The first comparator 133-1 may compare the ramp signal Vramp with the first output signal of the first CDS circuit 120-1 and may output a first comparison signal to the first counter 135-1 according to the comparison result. The first counter 135-1 may count a level transition time of the first comparison signal in response to the clock signal CLK and may output the first digital signals CNT1[n:0] according to the count result. Here, the level transition may refer to transition from low level to high level or from high level to low level.

The second ADC 131-2 may include a second comparator 133-2 and a second counter 135-2. The second comparator 133-2 may compare the ramp signal Vramp with the second output signal of the second CDS circuit 120-2 and may output a second comparison signal to the second counter 135-2 according to the comparison result. The second counter 135-2 may count a level transition time of the second comparison signal in response to the clock signal CLK and may output the second digital signals CNT2[n:0] according to the count result.

The third ADC 131-3 may include a third comparator 133-3 and a third counter 135-3. The third comparator 133-3 may compare the ramp signal Vramp with the third output signal of the third CDS circuit 120-3 and may output a third comparison signal to the third counter 135-3 according to the comparison result. The third counter 135-3 may count a level transition time of the third comparison signal in response to the clock signal CLK and may output the third digital signals CNT3[n:0] according to the count result.

The fourth ADC 131-4 may include a fourth comparator 133-4 and a fourth counter 135-4. The fourth comparator 133-4 may compare the ramp signal Vramp with the fourth output signal of the fourth CDS circuit 120-4 and may output a fourth comparison signal to the fourth counter 135-4 according to the comparison result. The fourth counter 135-4 may count a level transition time of the fourth comparison signal in response to the clock signal CLK and may output the fourth digital signals CNT4[n:0] according to the count result.

The output circuit block 140 may control an output timing of each digital signal output from the ADC block 130 in response to enable control signals EN[n:0]. The output circuit block 140 may be referred to as a data bus.

Figure 2:
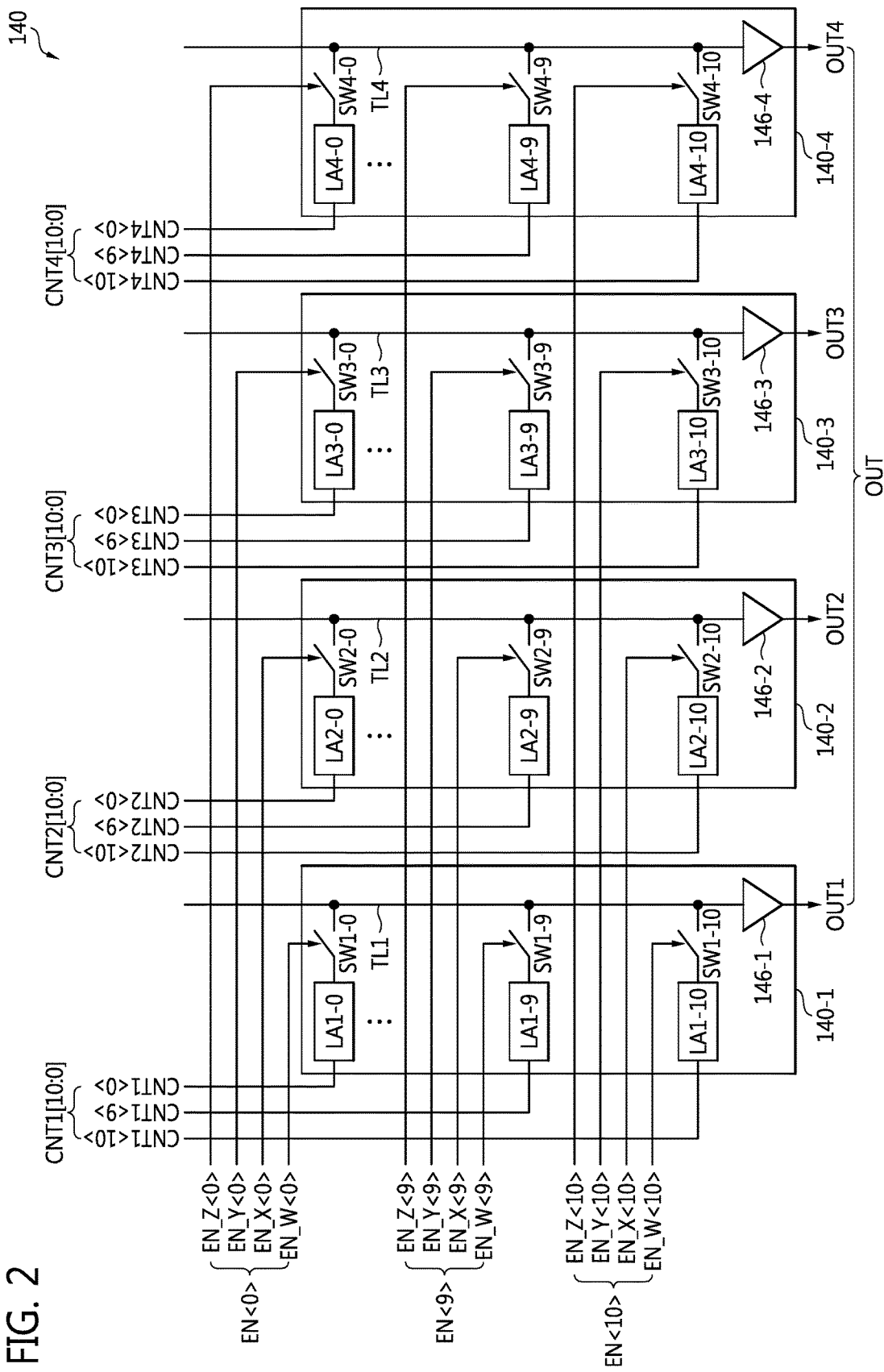
FIG. 2 is a diagram of an output circuit block illustrated in FIG. 1 according to some embodiments of the inventive concepts.

Referring to FIGS. 1 and 2, the output circuit block 140 may include a plurality of output circuits 140-1 through 140-4. The first output circuit 140-1 may output each bit in the first digital signals CNT1[n:0] output from the first ADC 131-1 as a first output signal OUT1 in response to one of first group enable control signals EN[n:0] (=EN_W[10:0]).

The second output circuit 140-2 may output each bit in the second digital signals CNT2[n:0] output from the second ADC 131-2 as a second output signal OUT2 in response to one of second group enable control signals EN[n:0] (=EN_X [10:0]). The third output circuit 140-3 may output each bit in the third digital signals CNT3[n:0] output from the third ADC 131-3 as a third output signal OUT3 in response to one of third group enable control signals EN[n:0] (=EN_Y[10:0]). The fourth output circuit 140-4 may output each bit in the fourth digital signals CNT4[n:0] output from the fourth ADC 131-4 as a fourth output signal OUT4 in response to one of fourth group enable control signals EN[n:0] (=EN_Z [10:0]).

The first output circuit 140-1 may include first latches 142-1 and a first output driver 146-1. The first latches 142-1 may respectively latch bits in the first digital signals CNT1 [n:0] and may respectively output the bits in the first digital signals CNT1[n:0] to the first output driver 146-1 in response to the first group enable control signals EN_W[10: 0], respectively. The enable timing of the first group enable control signals EN_W[10:0] will be described with reference to FIG. 3 later. The first output driver 146-1 may sequentially output each bit in the first digital signals CNT1[n:0] as the first output signal OUT1. The bits in the first digital signals CNT1[n:0] (=OUT1) sequentially output from the first output driver 146-1 may be stored in a first first-in first-out (FIFO).

The second output circuit 140-2 may include second latches 142-2 and a second output driver 146-2. The second latches 142-2 may respectively latch bits in the second digital signals CNT2[n:0] and may respectively output the bits in the second digital signals CNT2[n:0] to the second output driver 146-2 in response to the second group enable control signals EN_X[10:0], respectively. The enable timing of the second group enable control signals EN_X[10:0] will be described with reference to FIG. 3 later. The second output driver 146-2 may sequentially output each bit of the second digital signals CNT2[n:0] as the second output signal OUT2. The bits of the second digital signals CNT2[n:0] (=OUT2) sequentially output from the second output driver 146-2 may be stored in a second FIFO.

The third output circuit 140-3 may include third latches 142-3 and a third output driver 146-3. The third latches 142-3 may respectively latch bits in the third digital signals CNT3[n:0] and may respectively output the bits in the third digital signals CNT3[n:0] to the third output driver 146-3 in response to the third group enable control signals EN_Y[10:0], respectively. The enable timing of the third group enable control signals EN_Y[10:0] will be described with reference to FIG. 3 later. The third output driver 146-3 may sequentially output each bit of the third digital signals CNT3[n:0] as the third output signal OUT3. The bits of the third digital signals CNT3[n:0] (=OUT3) sequentially output from the third output driver 146-3 may be stored in a third FIFO.

The fourth output circuit 140-4 may include fourth latches 142-4 and a fourth output driver 146-4. The fourth latches 142-4 may respectively latch bits in the fourth digital signals CNT4[n:0] and may respectively output the bits in the fourth digital signals CNT4[n:0] to the fourth output driver 146-4 in response to the fourth group enable control signals EN_Z[10:0], respectively. The enable timing of the fourth group enable control signals EN_Z[10:0] will be described with reference to FIG. 3 later. The fourth output driver 146-4 may sequentially output each bit of the fourth digital signals CNT4[n:0] as the fourth output signal OUT4. The bits of the fourth digital signals CNT4[n:0] (=OUT4) sequentially output from the fourth output driver 146-4 may be stored in a fourth FIFO.

Each of the first through fourth latches 142-1 through 142-4 is a memory element which can store one-bit information (or data) and may be formed of static random access memory (SRAM), but the inventive concepts is not restricted to the current embodiments.

Consequently, the image sensor 100A includes a plurality of ADCs, each of which converts an analog pixel signal output from each of a plurality of pixels in one row into an n-bit digital signal (where "n" is a natural number of at least 2), and a plurality of output circuits, each of which outputs, at a different timing, an i-th bit (where $1 \leq i \leq n$) in the n-bit digital signal output from one of the ADCs in response to one of control signals enabled at different timings.

The ramp signal generator 150 may generate the ramp signal Vramp according to the control of the timing generator 170A. The ramping timing of the ramp signal Vramp may be controlled by the timing generator 170A.

The clock signal generator 155 may generate the clock signal CLK according to the control of the timing generator 170A. The frequency of the clock signal CLK may be controlled by the timing generator 170A. Although the clock signal generator 155 is controlled by the timing generator 170A to generate the clock signal CLK in FIG. 1, this is just an example.

The enable signal generator 160A may generate the enable control signals EN[n:0] in response to enable timing control signals OEN[n:0] output from the timing generator 170A and a select signal SEL output from the register 165. The register 165 is programmable memory and may store information or data for controlling the operation of the output circuit block 140. For example, the select signal SEL output from the register 165 may control the timing or the number of the enable control signals EN[n:0]. The select signal SEL may be a digital signal of at least one bit. For example, the register 165 may be implemented as a special function register (SFR).

The timing generator 170A may generate control signals for controlling the row controller 115, the ramp signal generator 150, the clock signal generator 155, and the enable signal generator 160A. The timing generator 170A may also control the CDS block 120.

Figure 3:
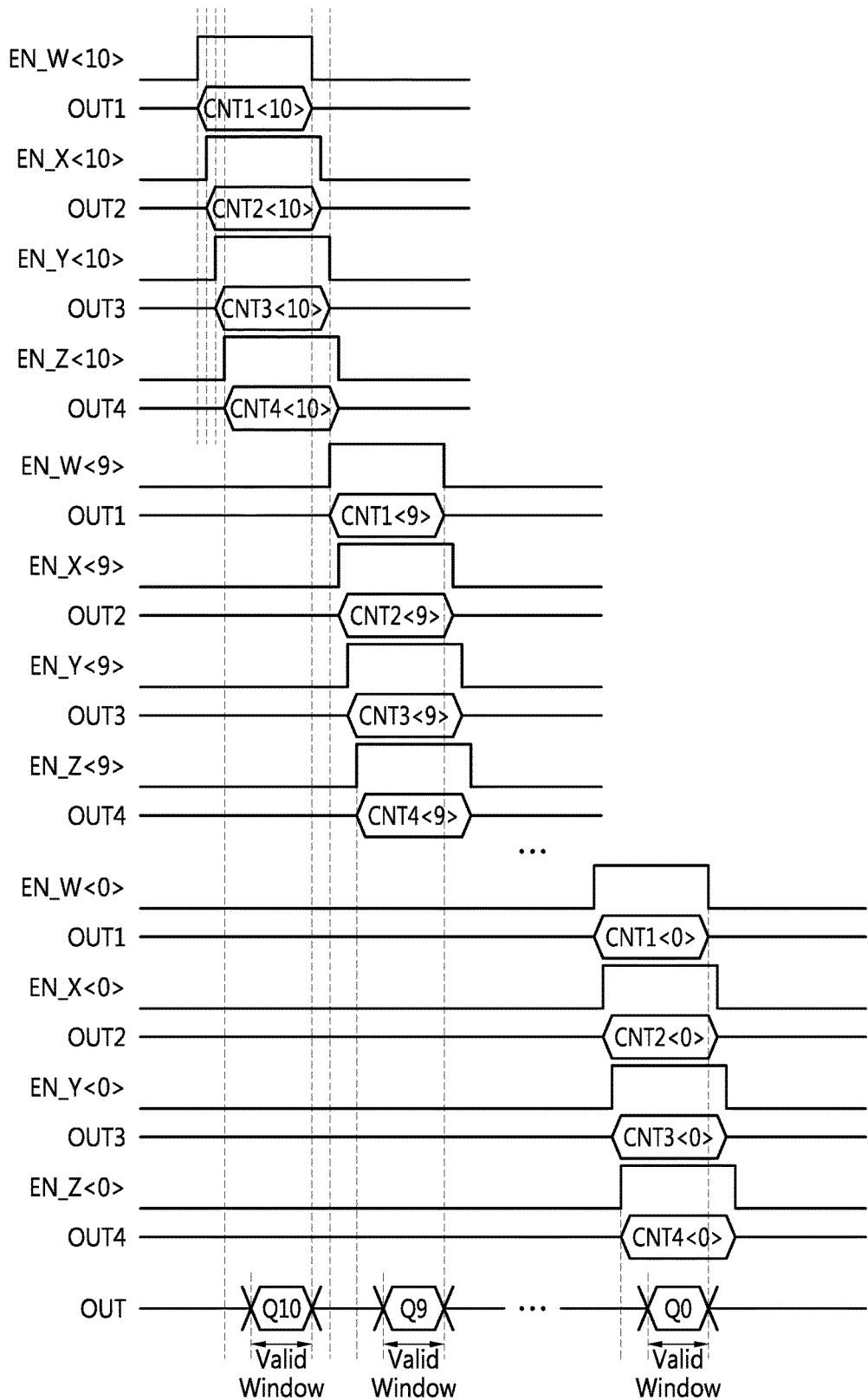
FIG. 3 is a timing chart of output signals output from the output circuit block illustrated in FIG. 2.

FIG. 2 is a diagram of the output circuit block 140 illustrated in FIG. 1 according to some embodiments of the inventive concepts. FIG. 3 is a timing chart of output signals output from the output circuit block 140 illustrated in FIG. 2.

Referring to FIGS. 1 through 3, it is assumed that the output circuit block 140 includes four output circuits 140-1 through 140-4, each of the digital signals CNT1[n:0] through CNT4[n:0] is a 11-bit digital signal, and each of the enable control signals EN[n:0] is divided into four control signals.

A conventional image sensor outputs column-parallel data to "n" output drivers using "n" enable control signals. However, according to some embodiments of the inventive concepts, the image sensor 100A outputs column-parallel data to "n" output drivers using A*n enable control signals. Here, A is a natural number of at least 2.

The first output circuit 140-1 includes eleven latches LA1-0 through LA1-10, eleven switches SW1-0 through SW1-10, a first transmission line TL1, and the first output driver 146-1. The second output circuit 140-2 includes eleven latches LA2-0 through LA2-10, eleven switches SW2-0 through SW2-10, a second transmission line TL2, and the second output driver 146-2. The third output circuit 140-3 includes eleven latches LA3-0 through LA3-10, eleven switches SW3-0 through SW3-10, a third transmission line TL3, and the third output driver 146-3. The fourth output circuit 140-4 includes eleven latches LA4-0 through LA4-10, eleven switches SW4-0 through SW4-10, a fourth transmission line TL4, and the fourth output driver 146-4. Each of the switches SW1-0 through SW1-10, SW2-0 through SW2-10, SW3-0 through SW3-10, and SW4-0 through SW4-10 is assumed to be implemented as an N-channel metal oxide semiconductor (NMOS) transistor.

When the enable control signal EN_W<10> is enabled to a high level, the digital signal CNT1<10> latched by the latch LA1-10 is transmitted to the first output driver 146-1 through the switch SW1-10 and the first transmission line TL1. The first output driver 146-1 outputs the digital signal CNT1<10> as the first output signal OUT1 (=CNT1<10>).

When the enable control signal EN_X<10> is enabled to a high level, the digital signal CNT2<10> latched by the latch LA2-10 is transmitted to the second output driver 146-2 through the switch SW2-10 and the second transmission line TL2. The second output driver 146-2 outputs the digital signal CNT2<10> as the second output signal OUT2 (=CNT2<10>).

When the enable control signal EN_Y<10> is enabled to a high level, the digital signal CNT3<10> latched by the latch LA3-10 is transmitted to the third output driver 146-3 through the switch SW3-10 and the third transmission line TL3. The third output driver 146-3 outputs the digital signal CNT3<10> as the third output signal OUT3 (=CNT3<10>).

When the enable control signal EN_Z<10> is enabled to a high level, the digital signal CNT4<10> latched by the latch LA4-10 is transmitted to the fourth output driver 146-4 through the switch SW4-10 and the fourth transmission line TL4. The fourth output driver 146-4 outputs the digital signal CNT4<10> as the fourth output signal OUT4 (=CNT4<10>).

The most significant bits (MSBs) CNT1<10>, CNT2<10>, CNT3<10>, and CNT4<10> of the respective digital signals CNT1[n:0], CNT2[n:0], CNT3[n:0], and CNT4[n:0] are output as the output signals OUT1 through OUT4, respectively, in response to the enable control signals EN_W<10>, EN_X<10>, EN_Y<10>, and EN_Z<10> enabled to a high level at different timings, respectively.

In FIG. 3, "Q10" collectively denotes the MSBs CNT1<10>, CNT2<10>, CNT3<10>, and CNT4<10> and has a valid window. For example, a delay of each of the enable control signals EN_W<10>, EN_X<10>, EN_Y<10>, and EN_Z<10> may be adjusted so that a falling edge of the enable control signal EN_W<10> is within a hold time of the fourth output signal OUT4 (=CNT4<10>). The enable control signals EN_W<10>, EN_X<10>, EN_Y<10>, and EN_Z<10> may be collectively denoted by an enable control signal EN<10>.

However, a conventional image sensor outputs the MSBs CNT1<10>, CNT2<10>, CNT3<10>, and CNT4<10> of the respective digital signals CNT1[10:0], CNT2[10:0], CNT3[10:0], and CNT4[10:0] as the output signals OUT1 through OUT4 at the same time using a single enable control signal.

FIG. 5A shows a waveform of a peak current in a conventional image sensor and FIG. 5B shows a waveform of a peak current in the image sensor illustrated in FIG. 1. Referring to FIG. 5A, when the MSBs CNT1<10>, CNT2<10>, CNT3<10>, and CNT4<10> of the respective digital signals CNT1[10:0], CNT2[10:0], CNT3[10:0], and CNT4[10:0] are simultaneously output, a peak current increases. However, referring to FIGS. 3 and 5B, the MSBs CNT1<10>, CNT2<10>, CNT3<10>, and CNT4<10> of the respective digital signals CNT1[10:0], CNT2[10:0], CNT3 [10:0], and CNT4[10:0] are output at different timings, so that the peak current is distributed.

When the enable control signal EN_W<9> is enabled to a high level, the digital signal CNT1<9> latched by the latch LA1-9 is transmitted to the first output driver 146-1 through the switch SW1-9 and the first transmission line TL1. The first output driver 146-1 outputs the digital signal CNT1<9> as the first output signal OUT1 (=CNT1<9>).

When the enable control signal EN_X<9> is enabled to a high level, the digital signal CNT2<9> latched by the latch LA2-9 is transmitted to the second output driver 146-2 through the switch SW2-9 and the second transmission line TL2. The second output driver 146-2 outputs the digital signal CNT2<9> as the second output signal OUT2 (=CNT2<9>).

When the enable control signal EN_Y<9> is enabled to a high level, the digital signal CNT3<9> latched by the latch LA3-9 is transmitted to the third output driver 146-3 through the switch SW3-9 and the third transmission line TL3. The third output driver 146-3 outputs the digital signal CNT3<9> as the third output signal OUT3 (=CNT3<9>).

When the enable control signal EN_Z<9> is enabled to a high level, the digital signal CNT4<9> latched by the latch LA4-9 is transmitted to the fourth output driver 146-4 through the switch SW4-9 and the fourth transmission line TL4. The fourth output driver 146-4 outputs the digital signal CNT4<9> as the fourth output signal OUT4 (=CNT4<9>).

The second bit values CNT1<9>, CNT2<9>, CNT3<9>, and CNT4<9> of the respective digital signals CNT1[n:0], CNT2[n:0], CNT3[n:0], and CNT4[n:0] are output as the output signals OUT1 through OUT4, respectively, in response to the enable control signals EN_W<9>, EN_X<9>, EN_Y<9>, and EN_Z<9> enabled to a high level at different timings, respectively.

In FIG. 3, "Q9" collectively denotes the second bit values CNT1<9>. CNT2<9>, CNT3<9>, and CNT4<9> and has a valid window. For example, a delay of each of the enable control signals EN_W<9>, EN_X<9>, EN_Y<9>, and EN_Z<9> may be adjusted so that a falling edge of the enable control signal EN_W<9> is within a hold time of the fourth output signal OUT4 (=CNT4<9>). The enable control signals EN_W<9>, EN_X<9>, EN_Y<9>, and EN_Z<9> may be collectively denoted by an enable control signal EN<9>.

However, a conventional image sensor outputs the second bit values CNT1<9>, CNT2<9>, CNT3<9>, and CNT4<9> of the respective digital signals CNT1[10:0], CNT2[10:0], CNT3[10:0], and CNT4[10:0] as the output signals OUT1 through OUT4 at the same time using a single enable control signal.

Referring to FIG. 5A, when the second bit values CNT1<9>, CNT2<9>, CNT3<9>, and CNT4<9> of the respective digital signals CNT1[10:0], CNT2[10:0], CNT3 [10:0], and CNT4[10:0] are simultaneously output, a peak current increases. However, referring to FIGS. 3 and 5B, the second bit values CNT1<9>, CNT2<9>, CNT3<9>, and CNT4<9> of the respective digital signals CNT1[10:0], CNT2[10:0], CNT3[10:0], and CNT4[10:0] are output at different timings, so that the peak current is distributed.

When the enable control signal EN_W<0> is enabled to a high level, the digital signal CNT1<0> latched by the latch LA-0 is transmitted to the first output driver 146-1 through the switch SW1-0 and the first transmission line TL1. The first output driver 146-1 outputs the digital signal CNT1<0> as the first output signal OUT1 (=CNT1<0>).

When the enable control signal EN_X<0> is enabled to a high level, the digital signal CNT2<0> latched by the latch LA2-0 is transmitted to the second output driver 146-2 through the switch SW2-0 and the second transmission line TL2. The second output driver 146-2 outputs the digital signal CNT2<0> as the second output signal OUT2 (=CNT2<0>).

When the enable control signal EN_Y<0> is enabled to a high level, the digital signal CNT3<0> latched by the latch LA3-0 is transmitted to the third output driver 146-3 through the switch SW3-0 and the third transmission line TL3. The third output driver 146-3 outputs the digital signal CNT3<0> as the third output signal OUT3 (=CNT3<0>).

When the enable control signal EN_Z<0> is enabled to a high level, the digital signal CNT4<0> latched by the latch LA4-0 is transmitted to the fourth output driver 146-4 through the switch SW4-0 and the fourth transmission line TL4. The fourth output driver 146-4 outputs the digital signal CNT4<0> as the fourth output signal OUT4 (=CNT4<0>).

The least significant bits (LSBs) CNT1<0>, CNT2<0>, CNT3<0>, and CNT4<0> of the respective digital signals CNT1[n:0], CNT2[n:0], CNT3[n:0], and CNT4[n:0] are output as the output signals OUT1 through OUT4, respectively, in response to the enable control signals EN_W<0>, EN_X<0>, EN_Y<0>, and EN_Z<0> enabled to a high level at different timings, respectively.

In FIG. 3, "Q0" collectively denotes the second bit values CNT1<0>, CNT2<0>, CNT3<0>, and CNT4<0> and has a valid window. For example, a delay of each of the enable control signals EN_W<0>, EN_X<0>, EN_Y<0>, and EN_Z<0> may be adjusted so that a falling edge of the enable control signal EN_W<0> is within a hold time of the fourth output signal OUT4 (=CNT4<0>). The enable control signals EN_W<0>, EN_X<0>, EN_Y<0>, and EN_Z<0> may be collectively denoted by an enable control signal EN<0>.

However, a conventional image sensor outputs the LSBs CNT1<0>, CNT2<0>, CNT3<0>, and CNT4<0> of the respective digital signals CNT1[10:0], CNT2[10:0], CNT3[10:0], and CNT4[10:0] as the output signals OUT1 through OUT4 at the same time using a single enable control signal.

Referring to FIG. 5A, when the LSBs CNT1<0>, CNT2<0>, CNT3<0>, and CNT4<0> of the respective digital signals CNT1[10:0], CNT2[10:0], CNT3[10:0], and CNT4[10:0] are simultaneously output, a peak current increases. However, referring to FIGS. 3 and 5B, the LSBs CNT1<0>, CNT2<0>, CNT3<0>, and CNT4<0> of the respective digital signals CNT1[10:0], CNT2[10:0], CNT3 [10:0], and CNT4[10:0] are output at different timings, so that the peak current is distributed.

Figure 4:
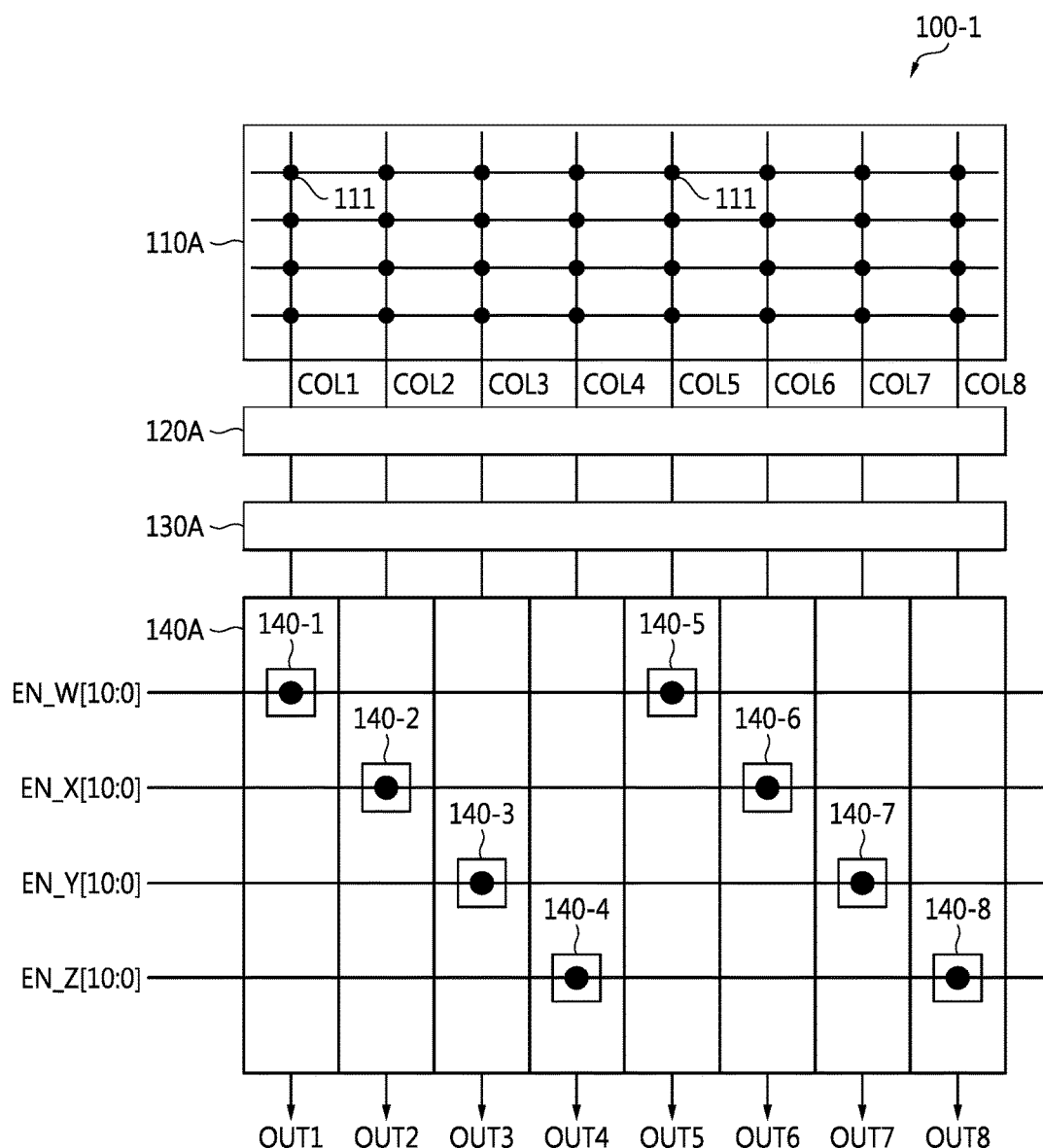
FIG. 4 is a block diagram of an image sensor for explaining a process of distributing an output peak current according to some embodiments of the inventive concepts.

FIG. 4 is a block diagram of an image sensor 100-1 for explaining a process of distributing an output peak current according to some embodiments of the inventive concepts. Here, the output peak current may be a current that occurs when digital signals are transmitted from latches to output drivers.

Referring to FIG. 4, the image sensor 100-1 may include a pixel array 110A, a CDS block 120A, an ADC block 130A, and an output circuit block 140A. The CDS block 120A may include CDS circuits. Each of the CDS circuits may perform CDS on an analog pixel signal output through one of column lines COL1 through COL8 and may output a CDS pixel signal.

The ADC block 130A may include a plurality of ADCs. Each of the ADCs may convert an output signal of one of the CDS circuits into digital signals. Each of the ADCs may include a comparator and a counter. For example, the structure of the comparator may be the same as or similar to that of the comparator 133-1. The structure of the counter may be the same as or similar to that of the counter 135-1.

Processing circuits related to the four column lines COL1 through COL4 are illustrated in FIG. 1. FIG. 4 shows processing circuits related to the eight column lines COL1 through COL8.

Referring to FIGS. 2 through 4, the first output circuit 140-1 may control the output timing of each bit of first digital signals output from a first ADC in response to each of the first group enable control signals EN[n:0] (=EN_W [10:0]) and may output the first output signal OUT1 at the controlled output timing. A fifth output circuit 140-5 may also control the output timing of each bit of fifth digital signals output from a fifth ADC in response to each of the first group enable control signals EN[n:0] (=EN_W[10:0]) and may output a fifth output signal OUT5 at the controlled output timing.

At this time, the first ADC may generate the first digital signals related to a first analog pixel signal output through the first column line COL1 and the fifth ADC may generate the fifth digital signals related to a fifth analog pixel signal output through the fifth column line COL5. For instance, when the first digital signals have eleven bits and the fifth digital signals have eleven bits, a value of an i-th bit in the first digital signals and a value of an i-th bit in the fifth digital signals may be simultaneously output, where $1 \leq i \leq 11$.

The second output circuit 140-2 may control the output timing of each bit of second digital signals output from a second ADC in response to each of the second group enable control signals EN[n:0] (=EN_X[10:0]) and may output the second output signal OUT2 at the controlled output timing. A sixth output circuit 140-6 may control the output timing of each bit of sixth digital signals output from a sixth ADC in response to each of the second group enable control signals EN[n:0] (=EN_X[10:0]) and may output a sixth output signal OUT6 at the controlled output timing.

At this time, the second ADC may generate the second digital signals related to a second analog pixel signal output through the second column line COL2 and the sixth ADC may generate the sixth digital signals related to a sixth analog pixel signal output through the sixth column line COL6. For instance, when the second digital signals have eleven bits and the sixth digital signals have eleven bits, a value of an i-th bit in the second digital signals and a value of an i-th bit in the sixth digital signals may be simultaneously output.

The third output circuit 140-3 may control the output timing of each bit of third digital signals output from a third ADC in response to each of the third group enable control signals EN[n:0] (=EN_Y[10:0]) and may output the third output signal OUT3 at the controlled output timing. A seventh output circuit 140-7 may control the output timing of each bit of seventh digital signals output from a seventh ADC in response to each of the third group enable control signals EN[n:0] (=EN_Y[10:0]) and may output a seventh output signal OUT7 at the controlled output timing.

At this time, the third ADC may generate the third digital signals related to a third analog pixel signal output through the third column line COL3 and the seventh ADC may generate the seventh digital signals related to a seventh analog pixel signal output through the seventh column line COL7. For instance, when the third digital signals have eleven bits and the seventh digital signals have eleven bits, a value of an i-th bit in the third digital signals and a value of an i-th bit in the seventh digital signals may be simultaneously output.

The fourth output circuit 140-4 may control the output timing of each bit of fourth digital signals output from a fourth ADC in response to each of the fourth group enable control signals EN[n:0] (=EN_Z[10:0]) and may output the fourth output signal OUT4 at the controlled output timing. An eighth output circuit 140-8 may control the output timing of each bit of eighth digital signals output from an eighth ADC in response to each of the fourth group enable control signals EN[n:0] (=EN_Z[10:0]) and may output an eighth output signal OUT8 at the controlled output timing.

At this time, the fourth ADC may generate the fourth digital signals related to a fourth analog pixel signal output through the fourth column line COL4 and the eighth ADC may generate the eighth digital signals related to an eighth analog pixel signal output through the eighth column line COL8. For instance, when the fourth digital signals have eleven bits and the eighth digital signals have eleven bits, a value of an i-th bit in the fourth digital signals and a value of an i-th bit in the eighth digital signals may be simultaneously output.

FIG. 5A shows a waveform of a peak current in a conventional image sensor and FIG. 5B shows a waveform of a peak current in the image sensor 100-1 illustrated in FIG. 4. FIG. 5A shows the waveform of a peak current when the values of i-th bits in respective digital signals output from respective ADCs included in an ADC block. FIG. 5B shows the waveform of a peak current when each of all ADCs included in the ADC block 130A is assigned to one of four groups and the values of i-th bits of respective digital signals output from respective ADCs respectively assigned to different groups are output at different timings, respectively.

As described above with reference to FIG. 4, the value of the i-th bit in the first digital signals output from the first ADC assigned to the first group and the value of the i-th bit in the fifth digital signals output from the fifth ADC assigned to the first group are simultaneously output. Thereafter, the value of the i-th bit in the second digital signals output from the second ADC assigned to the second group and the value of the i-th bit in the sixth digital signals output from the sixth ADC assigned to the second group are simultaneously output. Thereafter, the value of the i-th bit in the third digital signals output from the third ADC assigned to the third group and the value of the i-th bit in the seventh digital signals output from the seventh ADC assigned to the third group are simultaneously output. Thereafter, the value of the i-th bit in the fourth digital signals output from the fourth ADC assigned to the fourth group and the value of the i-th bit in the eighth digital signals output from the eighth ADC assigned to the fourth group are simultaneously output.

When FIG. 5A is compared with FIG. 5B, the peak current in FIG. 5A is distributed as shown in FIG. 5B.

Figure 6:
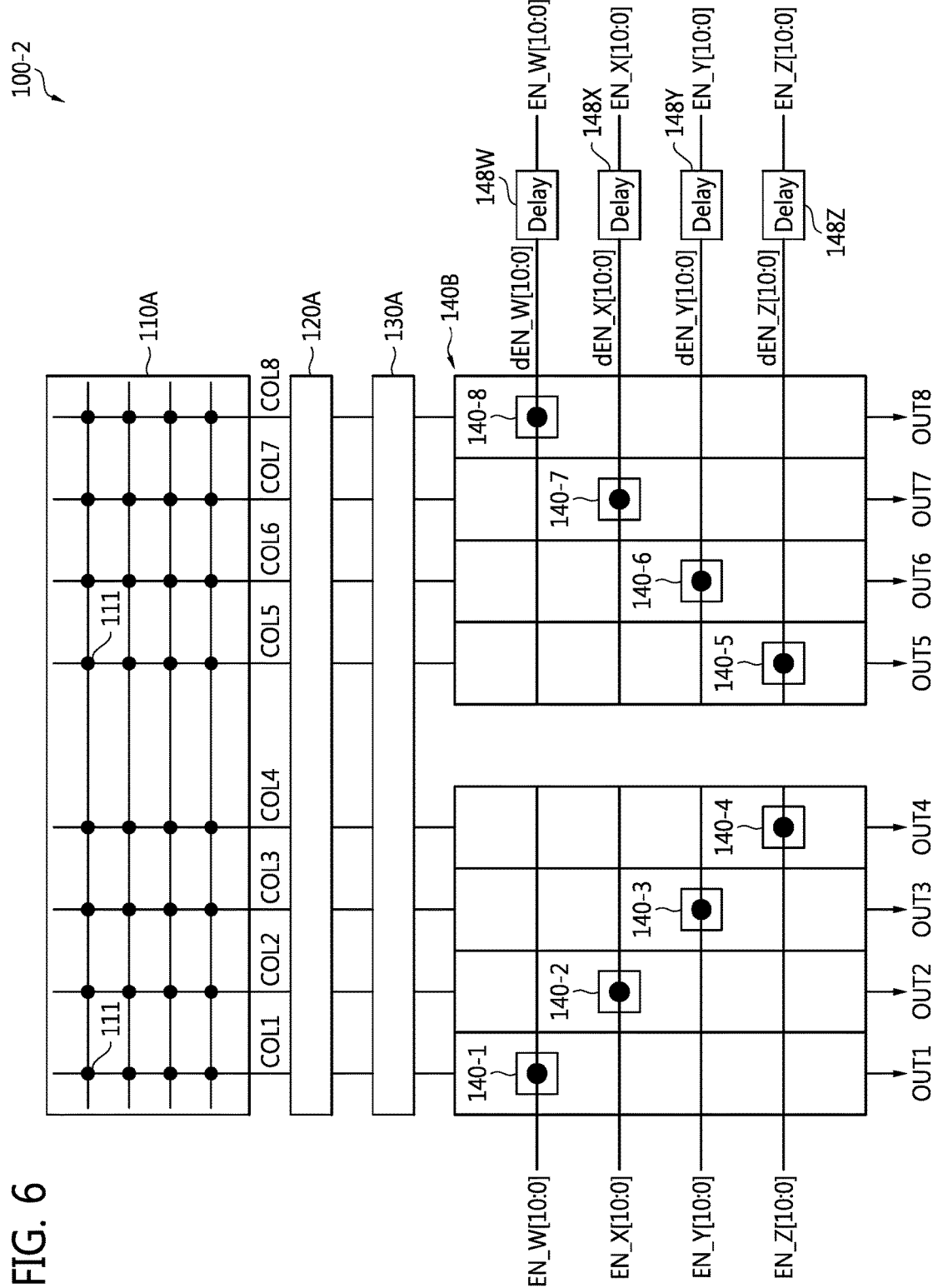
FIG. 6 is a block diagram of an image sensor according to other embodiments of the inventive concepts.

FIG. 6 is a block diagram of an image sensor 100-2 according to other embodiments of the inventive concepts. Referring to FIG. 6, the image sensor 100-2 may include a pixel array 110A, a CDS block 120A, a ADC block 130A, and an output circuit block 140B. Although the pixel array 110A includes two banks in the embodiments illustrated in FIG. 6, the number of banks may be changed in other embodiments.

A first delay 148W may delay the first group enable control signals EN[n:0] (=EN_W[10:0]), thereby generating fifth group enable control signals dEN_W[10:0]. A second delay 148X may delay the second group enable control signals EN[n:0] (=EN_X[10:0]), thereby generating sixth group enable control signals dEN_X[10:0]. A third delay 148Y may delay the third group enable control signals EN[n:0] (=EN_Y[10:0]), thereby generating seventh group enable control signals dEN_Y[10:0]. A fourth delay 148Z may delay the fourth group enable control signals EN[n:0] (=EN_Z[10:0]), thereby generating eighth group enable control signals dEN_Z[10:0].

The enable timing of each of the fifth enable control signals dEN_W[10:0], the enable timing of each of the sixth enable control signals dEN_X[10:0], the enable timing of each of the seventh enable control signals dEN_Y[10:0], and the enable timing of each of the eighth enable control signals dEN_Z[10:0] may be adjusted by the delays 148W, 148X, 148Y, and 148Z, respectively. For example, each of the delays 148W, 148X, 148Y, and 148Z may include an RC delay for a transmission line and may refer to a delay by a buffer.

The first output circuit 140-1 may control the output timing of each bit in the first digital signals output from the first ADC in response to each of the first group enable control signals EN_W[10:0] and may output the first output signal OUT1 at the controlled output timing. The eighth output circuit 140-8 may control the output timing of each bit in the eighth digital signals output from the eighth ADC in response to each of the fifth group enable control signals dEN_W[10:0] and may output the eighth output signal OUT8 at the controlled output timing.

The second output circuit 140-2 may control the output timing of each bit in the second digital signals output from the second ADC in response to each of the second group enable control signals EN_X[10:0] and may output the second output signal OUT2 at the controlled output timing. The seventh output circuit 140-7 may control the output timing of each bit in the seventh digital signals output from the seventh ADC in response to each of the sixth group enable control signals dEN_X[10:0] and may output the seventh output signal OUT7 at the controlled output timing.

The third output circuit 140-3 may control the output timing of each bit in the third digital signals output from the third ADC in response to each of the third group enable control signals EN_Y[10:0] and may output the third output signal OUT3 at the controlled output timing. The sixth output circuit 140-6 may control the output timing of each bit in the sixth digital signals output from the sixth ADC in response to each of the seventh group enable control signals dEN_Y[10:0] and may output the sixth output signal OUT6 at the controlled output timing.

The fourth output circuit 140-4 may control the output timing of each bit in the fourth digital signals output from the fourth ADC in response to each of the fourth enable control signals EN_Z[10:0] and may output the fourth output signal OUT4 at the controlled output timing. The fifth output circuit 140-5 may control the output timing of each bit in the fifth digital signals output from the fifth ADC in response to one of the eighth group enable control signals dEN_Z[10:0] and may output the fifth output signal OUT5 at the controlled output timing.

Figures 7, 8:
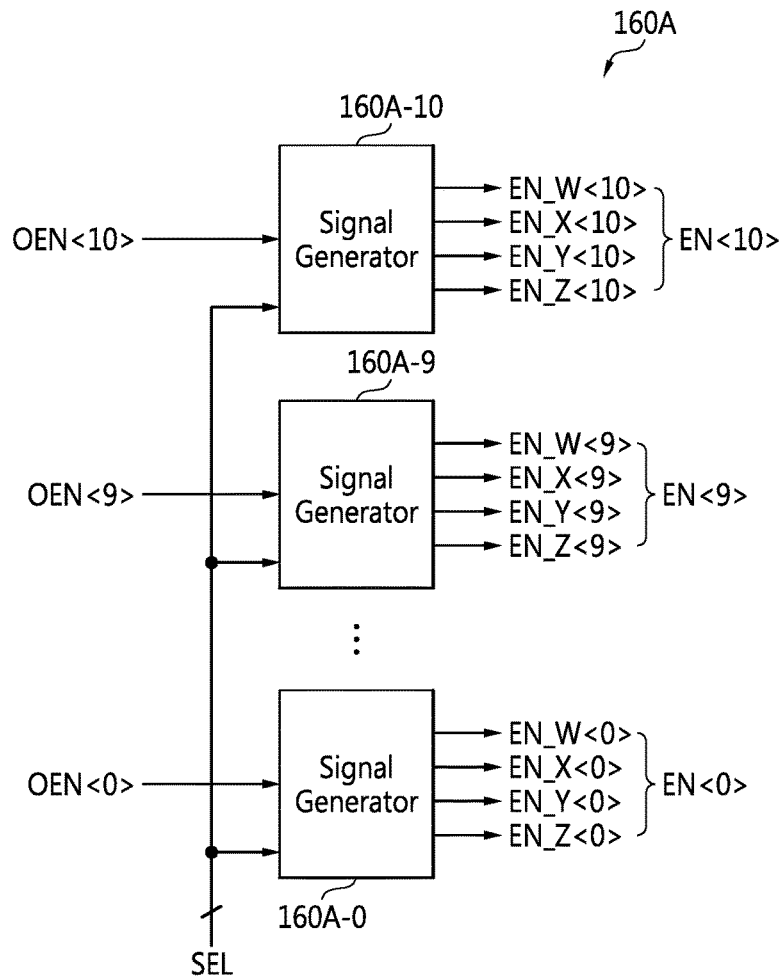
FIG. 7 is a block diagram of an enable signal generator according to some embodiments of the inventive concepts.
FIG. 8 is a table for explaining a select signal output from a register illustrate din FIG. 1 and the operation of the enable signal generator.

FIG. 7 is a block diagram of the enable signal generator 160A according to some embodiments of the inventive concepts. FIG. 8 is a table for explaining the select signal SEL output from the register 165 illustrated in FIG. 1 and the operation of the enable signal generator 160A. Referring to FIGS. 1 through 8, the enable signal generator 160A may include a plurality of signal generators 160A-0 through 160A-10.

The first signal generator 160A-0 may generate the enable control signals EN_W<0>, EN_X<0>, EN_Y<0>, and EN_Z<0> in response to the first enable timing control signal OEN<0> and the select signal SEL. The enable control signals EN_W<0>, EN_X<0>, EN_Y<0>, and EN_Z<0> may be collectively denoted by the enable control signal EN<0>.

The tenth signal generator 160A-9 may generate the enable control signals EN_W<9>, EN_X<9>, EN_Y<9>, and EN_Z<9> in response to the tenth enable timing control signal OEN<9> and the select signal SEL. The enable control EN_W<9>, EN_X<9>, EN_Y<9>, and EN_Z<9> may be collectively denoted by the enable control signal EN<9>.

The eleventh signal generator 160A-10 may generate the enable control signals EN_W<10>, EN_X<10>, EN_Y<10>, and EN_Z<10> in response to the eleventh enable timing control signal OEN<10> and the select signal SEL. The enable control signals EN_W<10>, EN_X<10>, EN_Y<10>, and EN_Z<10> may be collectively denoted by the enable control signal EN<10>.

When the select signal SEL has a first value SEL1, the enable control signals EN_W<i>, EN_X<i>, EN_Y<i>, and EN_Z<i> may be enabled to a high level at the same enable timing. At this time, the image sensor 100A may operate in normal mode.

When the select signal SEL has a second value SEL2, two in each of the pairs of the enable control signals EN_W<i>, EN_X<i>, EN_Y<i>, and EN_Z<i> may be enabled to the high level at the same enable timing. For instance, the enable control signals EN_W<i> and EN_X<i> may be enabled to the high level at a first timing and the enable control signals EN_Y<i> and EN_Z<i> may be enabled to the high level at a second timing. At this time, the image sensor 100A may operate in 2-split mode.

When the select signal SEL has a third value SEL3, the enable control signals EN_W<i>, EN_X<i>, EN_Y<i>, and EN_Z<i> may be enabled to the high level at different enable timings. At this time, the image sensor 100A may operate in 4-split mode. The operating mode of the image sensor 100A may be determined according to information or data set or programmed in the register 165.

Figure 9:
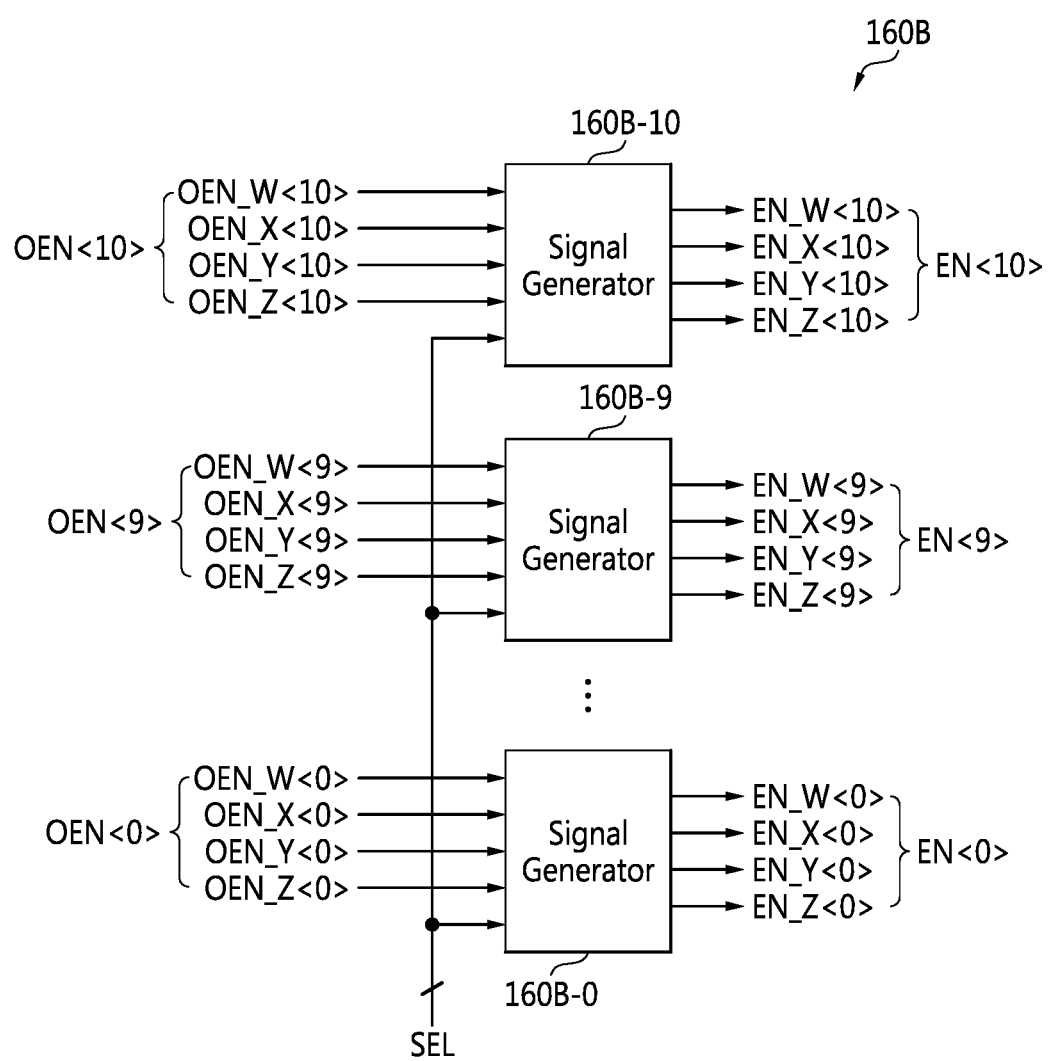
FIG. 9 is a block diagram of an enable signal generator according to other embodiments of the inventive concepts.

FIG. 9 is a block diagram of an enable signal generator 160B according to other embodiments of the inventive concepts. Referring to FIGS. 1 and 9, the enable signal generator 160B may include a plurality of signal generators 160B-0 through 160B-10. The enable signal generator 160B may selectively output at least one of the enable timing control signal OEN[10:0] output from the timing generator 170A in response to the select signal SEL output from the register 165.

When the select signal SEL has the first value SEL1, the first signal generator 160B-0 may generate the enable control signals EN_W<0>, EN_X<0>, EN_Y<0>, and EN_Z<0> having the same timing as an enable timing control signal OEN_W<0>. When the select signal SEL has the first value SEL1, the tenth signal generator 160B-9 may generate the enable control signals EN_W<9>, EN_X<9>, EN_Y<9>, and EN_Z<9> having the same timing as an enable timing control signal OEN_W<9>. When the select signal SEL has the first value SEL1, the eleventh signal generator 160B-10 may generate the enable control signals EN_W<10>, EN_X<10>, EN_Y<10>, and EN_Z<10> having the same timing as an enable timing control signal OEN_W<10>.

When the select signal SEL has the second value SEL2, the first signal generator 160B-0 may generate the enable control signals EN_W<0> and EN_X<0> having the same timing as one of the enable timing control signals OEN_W<0> and OEN_X<0>. When the select signal SEL has the second value SEL2, the first signal generator 160B-0 may also generate the enable control signals EN_Y<0> and EN_Z<0> having the same timing as one of the enable timing control signals OEN_Y<0> and OEN_Z<0>.

When the select signal SEL has the second value SEL2, the tenth signal generator 160B-9 may generate the enable control signals EN_W<9> and EN_X<9> having the same timing as one of the enable timing control signals OEN_W<9> and OEN_X<9>. When the select signal SEL has the second value SEL2, the tenth signal generator 160B-9 may also generate the enable control signals EN_Y<9> and EN_Z<9> having the same timing as one of the enable timing control signals OEN_Y<9> and OEN_Z<9>.

When the select signal SEL has the second value SEL2, the eleventh signal generator 160B-10 may generate the enable control signals EN_W<10> and EN_X<10> having the same timing as one of the enable timing control signals OEN_W<10> and OEN_X<10>. When the select signal SEL has the second value SEL2, the eleventh signal generator 160B-10 may also generate the enable control signals EN_Y<10> and EN_Z<10> having the same timing as one of the enable timing control signals OEN_Y<10> and OEN_Z<10>.

When the select signal SEL has the third value SEL3, the first signal generator 160B-0 may generate the enable control signals EN_W<0>, EN_X<0>, EN_Y<0>, and EN_Z<0> respectively having the same timings as the enable timing control signals OEN_W<0>, OEN_X<0>, OEN_Y<0>, and OEN_Z<0>. The enable timing control signals OEN_W<0>, OEN_X<0>, OEN_Y<0>, and OEN_Z<0> have different enable timings, respectively.

When the select signal SEL has the third value SEL3, the tenth signal generator 160B-9 may generate the enable control signals EN_W<9>, EN_X<9>, EN_Y<9>, and EN_Z<9> respectively having the same timings as the enable timing control signals OEN_W<9>, OEN_X<9>, OEN_Y<9>, and OEN_Z<9>. The enable timing control signals OEN_W<9>, OEN_X<9>, OEN_Y<9>, and OEN_Z<9> have different enable timings, respectively.

When the select signal SEL has the third value SEL3, the eleventh signal generator 160B-10 may generate the enable control signals EN_W<10>, EN_X<10>, EN_Y<10>, and EN_Z<10> respectively having the same timings as the enable timing control signals OEN_W<10>, OEN_X<10>, OEN_Y<10>, and OEN_Z<10>. The enable timing control signals OEN_W<10>, OEN_X<10>, OEN_Y<10>, and OEN_Z<10> have different enable timings, respectively.

In other words, when the select signal SEL has the first value SEL1, the image sensor 100A may operate in normal mode. When the select signal SEL has the second or third value SEL2 or SEL3, the image sensor 100A may operate in split mode.

Figure 10:
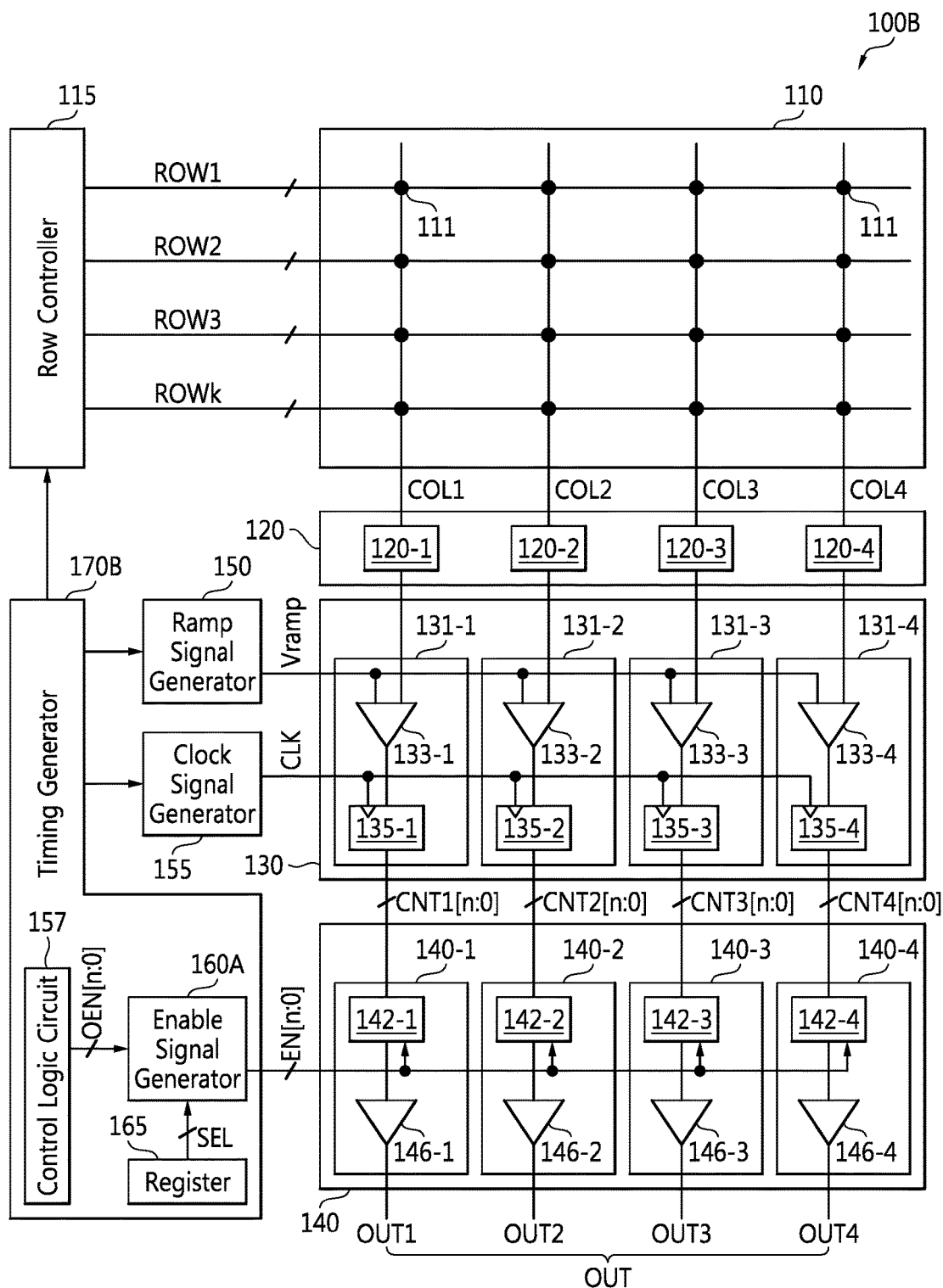
FIG. 10 is a block diagram of an image sensor according to further embodiments of the inventive concepts.

FIG. 10 is a block diagram of an image sensor 100B according to further embodiments of the inventive concepts. With the exception that a timing generator 170B includes a control logic circuit 157, an enable signal generator 160A, and a register 165; the structure and operations of the image sensor 100B illustrated in FIG. 10 are the same or similar to those of the image sensor 100A illustrated in FIG. 1.

The control logic circuit 157 may generate the enable timing control signals OEN[n:0] for controlling the enable signal generator 160A. The enable signal generator 160A may control the timings of the enable control signals EN[n:0] in response to the enable timing control signals OEN[n:0] output from the control logic circuit 157 and the select signal SEL output from the register 165.

Figure 11:
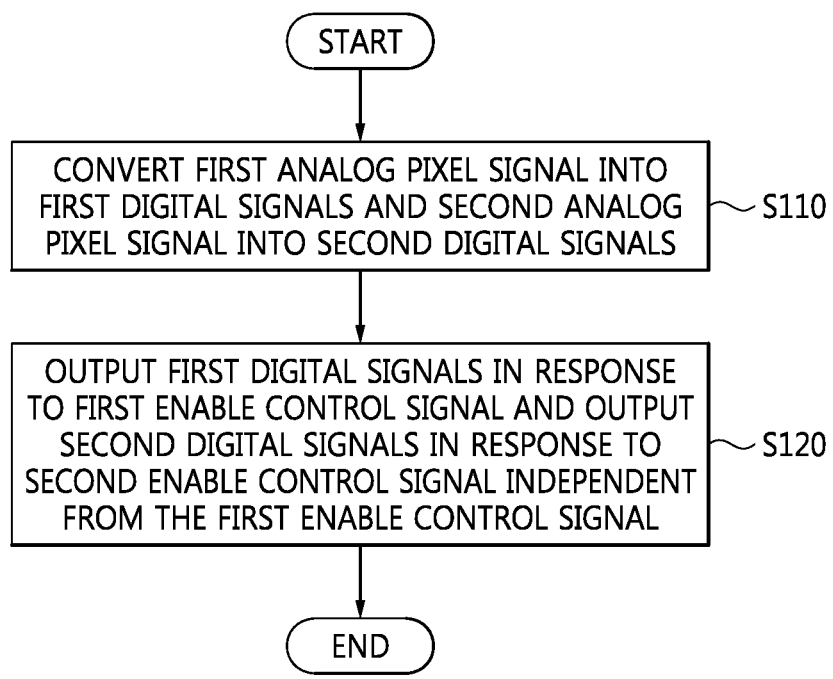
FIG. 11 is a flowchart of the operation of the image sensor illustrated in FIG. 1 or 10 according to some embodiments of the inventive concepts.

FIG. 11 is a flowchart of the operation of the image sensor 100A or 100B illustrated in FIG. 1 or 10 according to some embodiments of the inventive concepts. Referring to FIGS. 1 through 11, the first ADC 131-1 converts a first analog pixel signal output from a first pixel in the pixel array 110 into the first digital signals CNT1[n:0] and the second ADC 131-2 converts a second analog pixel signal output from a second pixel in the pixel array 110 into the second digital signals CNT2[n:0] in operation S110. The first pixel and the second pixel may be in the same row.

The first output circuit 140-1 outputs a first bit value of the i-th bit in the first digital signals CNT1[n:0] in response to the first enable control signal EN_W<i> (where 0≤i≤n) and the second output circuit 140-2 outputs a second bit value of the i-th bit in the second digital signals CNT2[n:0] in response to the second enable control signal EN_X<i>. As described in FIG. 3, the enable timing of the first enable control signal EN_W<i> is different from that of the second enable control signal EN_X<i>.

The image sensor 100A, 100-1, 100-2, or 100B includes a transmission line for transmitting the first enable control signal EN_W<i> and a transmission line for transmitting the second enable control signal EN_X<i>. The enable signal generator 160A may generate the first enable control signal EN_W<i> and the second enable control signal EN_X<i>, which are independent from each other, at different timings. A source of the first enable control signal EN_W<i> may be different from that of the second enable control signal EN_X<i>.

Figure 12:
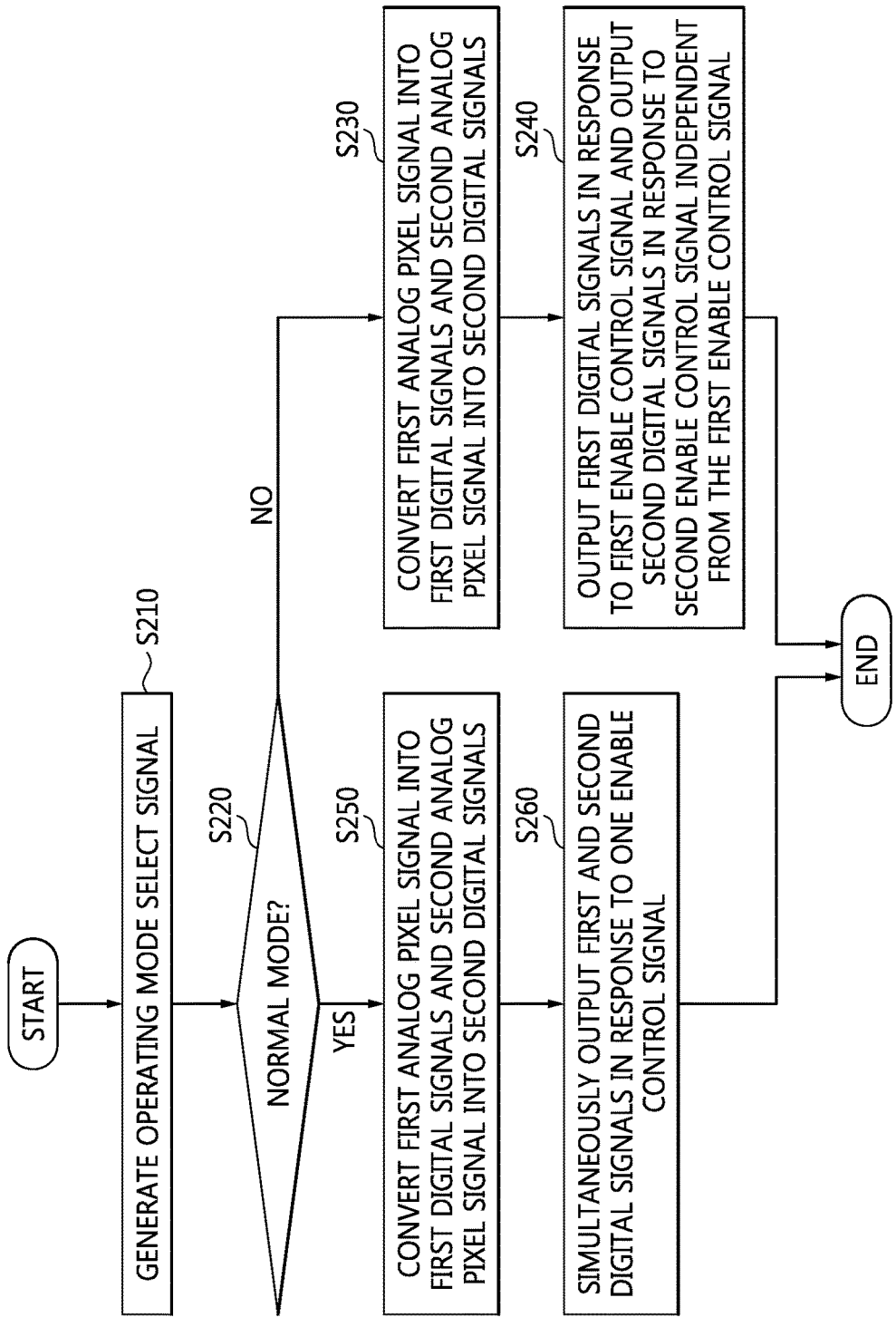
FIG. 12 is a flowchart of the operation of the image sensor illustrated in FIG. 1 or 10 according to other embodiments of the inventive concepts.

FIG. 12 is a flowchart of the operation of the image sensor 100A or 100B illustrated in FIG. 1 or 10 according to other embodiments of the inventive concepts. Referring to FIGS. 1 through 12, a controller that controls the image sensor 100A, 100-1, 100-2, or 100B may set, in the register 165, information or data that determines an operating mode of the image sensor 100A, 100-1, 100-2, or 100B. The select signal SEL may be generated based on the information or data set in the register 165 in operation S210.

As described above, the operating mode may be normal mode or split mode. When the select signal SEL has the first value SEL1, the image sensor 100A, 100-1, 100-2, or 100B may operate in the normal mode. When the operating mode is the normal mode (i.e., in case of YES) in operation S220, the first ADC 131-1 converts a first analog pixel signal output from a first pixel of the pixel array 110 into the first digital signals CNT1[n:0] and the second ADC 131-2 converts a second analog pixel signal output from a second pixel of the pixel array 110 into the second digital signals CNT2[n:0] in operation S250. The output circuits 140-1 and 140-2 simultaneously output a first bit value of the i-th bit in the first digital signals CNT1[n:0] and a second bit value of the i-th bit in the second digital signals CNT2[n:0], respectively, in response to one enable control signal EN_W<i>=EN_X<i>=EN_Y<i>=EN_Z<i> in operation S260. The waveform of a peak current occurring at this time is shown in FIG. 5A.

However, when the operating mode is not the normal mode (i.e., in case of NO) in operation S220, the first ADC 131-1 converts the first analog pixel signal output from the first pixel of the pixel array 110 into the first digital signals CNT1[n:0] and the second ADC 131-2 converts the second analog pixel signal output from the second pixel of the pixel array 110 into the second digital signals CNT2[n:0] in operation S230. The first output circuit 140-1 outputs the first bit value of the i-th bit in the first digital signals CNT1[n:0] in response to the first enable control signal EN_W<i> and the second output circuit 140-2 outputs the second bit value of the i-th bit in the second digital signals CNT2[n:0] in response to the second enable control signal EN_X<i> in operation S240. As shown in FIG. 3, the enable timing of the first enable control signal EN_W<i> is different from that of the second enable control signal EN_X<i>. The waveform of a peak current occurring at this time is shown in FIG. 5B.

The operations of two ADCs 131-1 and 131-2 and two output circuits 140-1 and 140-2 are described with reference to FIGS. 11 and 12 for convenience' sake in the description. However, the inventive concepts is not restricted to the numbers of ADCs and output circuits.

Figure 13:
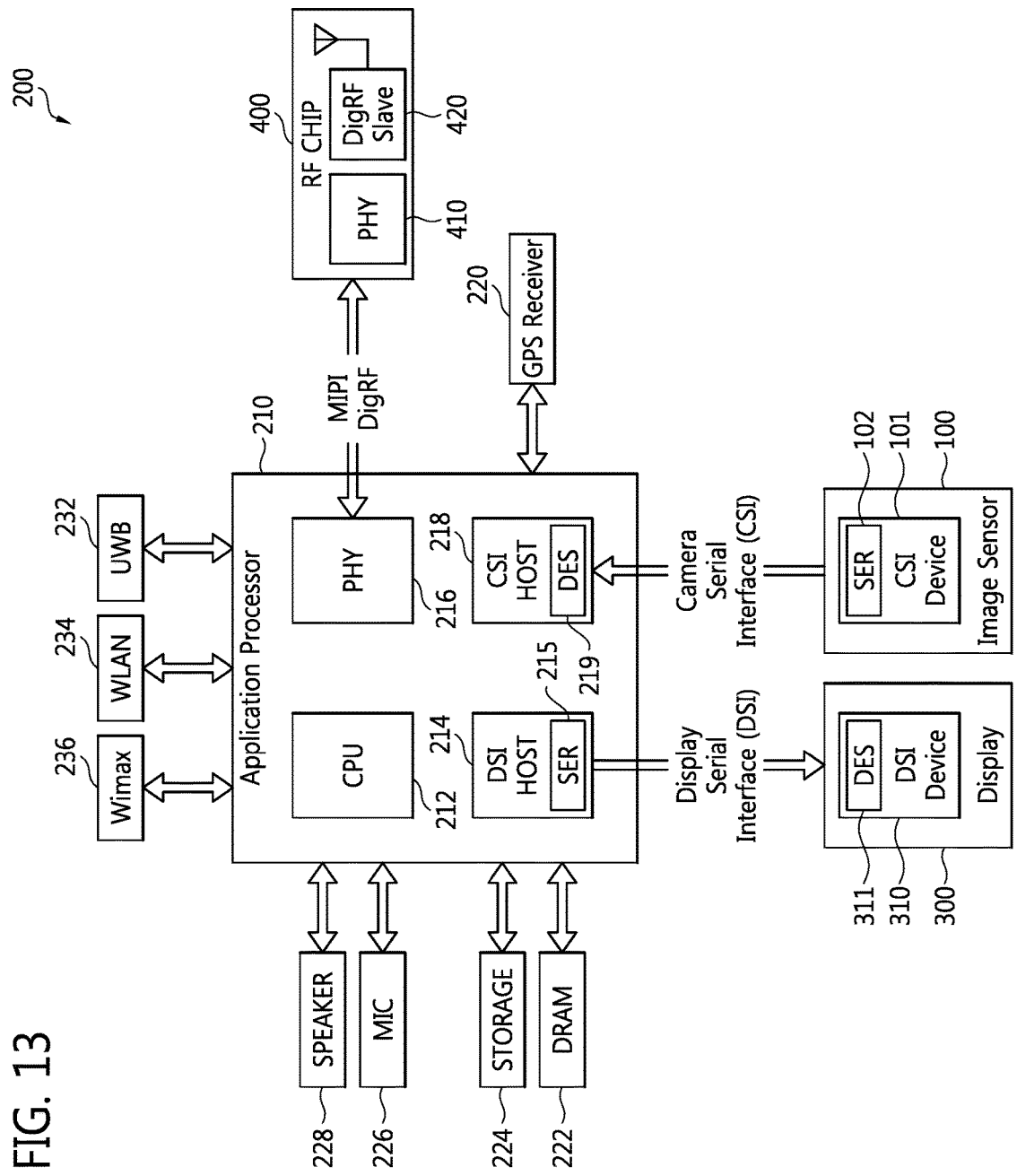
FIG. 13 is a block diagram of a data processing system including the image sensor illustrated in FIG. 1 or 10 according to some embodiments of the inventive concepts.

FIG. 13 is a block diagram of a data processing system 200 including the image sensor 100A or 100B illustrated in FIG. 1 or 10 according to some embodiments of the inventive concepts. Referring to FIGS. 1 through 13, the data processing system 200 may be implemented as an image data processing system which can use or support mobile industry processor interface (MIPI®). The data processing system 200 may be a laptop computer, a cellular phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, or a drone. The data processing system 200 includes an application processor (AP) 210, the image sensor 100A, 100-1, 100-2, or 100B (collectively denoted by "100"), and a display 300.

The AP 210 may be a controller or processor which can control the operations of the image sensor 100. The AP 210 may program data related to the operating mode of the image sensor 100 to the register 165. A camera serial interface (CSI) host 218 implemented in the AP 210 may perform serial communication with a CSI device 101 in the image sensor 100 through CSI. The CSI host 218 may include a deserializer (DES) 219 and the CSI device 101 may include a serializer (SER) 102.

A display serial interface (DSI) host 214 implemented in the AP 210 may perform serial communication with a DSI device 310 in the display 300 through DSI. The DSI host 214 may include a SER 215 and the DSI device 310 may include a DES 311. Image data output from the image sensor 100 may be transmitted to the AP 210 through CSI. The AP 210 may process the image data and may transmit the processed image data to the display 300 through DSI.

The data processing system 200 may also include a radio frequency (RF) chip 400 communicating with the AP 210. A physical layer (PHY) 216 of the AP 210 and a PHY 410 of the RF chip 400 may communicate data with each other according to MIPI DigRF.

A central processing unit (CPU) 212 may control the overall operation of the AP 210. The CPU 212 may also control the operations of the DSI host 214, the CSI host 218, and the PHY 216. The CPU 212 may include at least one core.

The AP 210 may be implemented in an integrated circuit IC or a system on chip (SoC). The AP 210 may refer to a processor or host which can control the operations of the image sensor 100.

The data processing system 200 may further include a global positioning system (GPS) receiver 220, a volatile memory 222 such as dynamic random access memory (DRAM), a data storage 224 implemented as a non-volatile memory such as flash-based memory, a microphone (MIC) 226, or a speaker 228. The data storage 224 may also be implemented as a universal flash storage (UFS), a multimedia card (MMC), an embedded MMC (eMMC), or a memory card.

The data processing system 200 may communicate with external devices using at least one communication protocol or standard, e.g., ultra-wideband (UWB) 232, wireless local area network (WLAN) 234, worldwide interoperability for microwave access (Wimax) 236, or long term evolution (LTE™; not shown). The data processing system 200 may also include a near field communication (NFC) module, a Wi-Fi module, or a Bluetooth module.

As described above, according to some embodiments of the inventive concepts, an image sensor distributes a peak current that may occur when transmitting column-parallel data to output buffers.

While the inventive concepts has been particularly shown and described with reference to example embodiments thereof, it will be understood by those of ordinary skill in the art that various changes in forms and details may be made therein without departing from the spirit and scope of the inventive concepts as defined by the following claims.

What is claimed is:

1. An image sensor comprising:
a first analog-to-digital converter configured to convert a first analog pixel signal output from a first pixel in a row into first digital signals;
a second analog-to-digital converter configured to convert a second analog pixel signal output from a second pixel in the row into second digital signals;
an enable signal generator configured to generate a first enable control signal and a second enable control signal, and control enable timings of the first enable control signal and the second enable control signal in response to a select signal, the enable signal generator configured to enable the first enable control signal and the second enable control signal at a same enable timing in response to the select signal having a first value and at different enable timings in response to the select signal having a second value;
a first output circuit configured to output a first bit value at a first position in the first digital signals in response to the first enable control signal; and
a second output circuit configured to output a second bit value at a second position in the second digital signals in response to the second enable control signal, the second position in the second digital signals corresponding to the first position in the first digital signals.

2. The image sensor of claim 1, further comprising:
a first transmission line configured to transmit the first enable control signal; and
a second transmission line configured to transmit the second enable control signal.

3. The image sensor of claim 2, further comprising:
an enable signal generator configured to generate the first enable control signal and the second enable control signal, which are independent from each other, at different enable timings.

4. The image sensor of claim 1, further comprising:
a register configured to output the select signal.

5. The image sensor of claim 1, wherein
the first analog-to-digital converter comprises,
a first comparator configured to compare a ramp signal with the first analog pixel signal output and generate a first comparison signal, and
a first counter configured to count a level transition time of the first comparison signal in response to a clock signal and output the first digital signals; and
the first output circuit comprises,
a first memory configured to store the first bit value,
a first output driver, and
a first switch configured to control connection between the first memory and the first output driver in response to the first enable control signal.

6. The image sensor of claim 5, wherein
the second analog-to-digital converter comprises,
a second comparator configured to compare the ramp signal with the second analog pixel signal output, and generate a second comparison signal, and
a second counter configured to count a level transition time of the second comparison signal in response to the clock signal and output the second digital signals; and the second output circuit comprises,
a second memory configured to store the second bit value,
a second output driver, and
a second switch configured to control connection between the second memory and the second output driver in response to the second enable control signal.

7. The image sensor of claim 6, wherein each of the first memory and the second memory is a latch or static random access memory (SRAM).

8. The image sensor of claim 1, wherein the first pixel and the second pixel are arranged in a same row.

9. An image processing system comprising:
an image sensor; and
a controller configured to control an operation of the image sensor,
wherein the image sensor comprises,
a first analog-to-digital converter configured to convert a first analog pixel signal output from a first pixel in a row into a first digital signals,
a second analog-to-digital converter configured to convert a second analog pixel signal output from a second pixel in the row into a second digital signals,
an enable signal generator configured to generate a first enable control signal and a second enable control signal, and control enable timings of the first enable control signal and the second enable control signal in response to a select signal, the enable signal generator configured to enable the first enable control signal and the second enable control signal at a same enable timing in response to the select signal having a first value and at different enable timings in response to the select signal having a second value,
a first output circuit configured to output a first bit value at a first position in the first digital signals in response to the first enable control signal, and
a second output circuit configured to output a second bit value at a second position in the second digital signals in response to the second enable control signal, the second position in the second digital signals corresponding to the first position in the first digital signals.

10. The image processing system of claim 9, wherein a source of the first enable control signal is different from a source of the second enable control signal.

11. The image processing system of claim 9, wherein the image sensor further comprises:
a first transmission line configured to transmit the first enable control signal; and
a second transmission line configured to transmit the second enable control signal.

12. The image processing system of claim 9, wherein the image sensor further comprises a register configured to output the select signal.

13. An image sensor comprising:
a plurality of analog-to-digital converters configured to respectively convert analog pixel signals, which are respectively output from a plurality of pixels arranged in one row, into respective n-bit digital signals, where "n" is a natural number of at least 2;
a control signal generator configured to generate a plurality of control signals and control enable timings of the control signals in response to a select signal such that the control signals are sequentially activated with a delay from corresponding preceding ones of the control signals, respectively, and an activation period of each of the control signals substantially overlaps an activation period of a corresponding preceding one of the control signals; and a plurality of output circuits configured to output i-th bits in the respective n-bit digital signals in response to the plurality of control signals, respectively, where $1 \leq i \leq n$.

14. The image sensor of claim 13, wherein the plurality of pixels are adjacent to each other.

15. The image sensor of claim 13, wherein the plurality of control signals are transmitted through different transmission lines.

16. The image sensor of claim 13, further comprising:
an enable signal generator configured to control enable timings of the respective control signals in response to a select signal output from tea register.

17. The image sensor of claim 13, wherein one of the output circuits comprises:
a memory configured to store the i-th bit in a corresponding one of the n-bit digital signals output from one of the analog-to-digital converters;
an output driver; and
a switch configured to control connection between the memory and the output driver in response to one of the control signals.

* * * * *